United States Patent
Hsieh et al.

(10) Patent No.: US 10,580,729 B2
(45) Date of Patent: Mar. 3, 2020

(54) CHIP ON FILM PACKAGE AND FLEXIBLE SUBSTRATE THEREOF

(71) Applicant: CHIPBOND TECHNOLOGY CORPORATION, Hsinchu (TW)

(72) Inventors: Chin-Tang Hsieh, Kaohsiung (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 15/952,814

(22) Filed: Apr. 13, 2018

(65) Prior Publication Data
US 2019/0252298 A1 Aug. 15, 2019

(30) Foreign Application Priority Data
Feb. 13, 2018 (TW) .............................. 107105137 A

(51) Int. Cl.
*H01L 23/498* (2006.01)
*H01L 23/00* (2006.01)
*H01L 23/31* (2006.01)

(52) U.S. Cl.
CPC ...... *H01L 23/4985* (2013.01); *H01L 23/3185* (2013.01); *H01L 23/49838* (2013.01); *H01L 23/562* (2013.01); *H01L 24/16* (2013.01); *H01L 2224/16225* (2013.01); *H01L 2224/32225* (2013.01); *H01L 2224/73204* (2013.01); *H01L 2924/1426* (2013.01)

(58) Field of Classification Search
None
See application file for complete search history.

(56) References Cited

U.S. PATENT DOCUMENTS

| 5,398,128 A | * | 3/1995 | Tajima | H01L 23/145 257/E23.007 |
| 6,104,464 A | * | 8/2000 | Adachi | G02F 1/13452 257/E23.177 |
| 6,624,520 B1 | * | 9/2003 | Nakamura | H01L 23/4985 257/737 |

(Continued)

FOREIGN PATENT DOCUMENTS

JP    3-174756 A    7/1991
JP    4-4773 U      1/1992

(Continued)

OTHER PUBLICATIONS

Taiwanese Office Action dated Jun. 5, 2018 for Taiwanese Patent Application No. 107105137, 8 pages.

(Continued)

*Primary Examiner* — Lex H Malsawma
(74) *Attorney, Agent, or Firm* — Jackson IPG PLLC; Demian K. Jackson

(57) ABSTRACT

A chip on film package includes a chip and a flexible substrate having a film and a circuit layer. The circuit layer is formed on a first surface of the film and electrically connected to the chip. At least one groove is recessed on a second surface of the film. The flexible substrate is bent to form flat portions and at least one curved portion located between the flat portions when it is bonded to external electronic components. The groove is located on the curved portion and provided to protect the curved portion of the flexible substrate from breaking.

15 Claims, 6 Drawing Sheets

(56) References Cited

U.S. PATENT DOCUMENTS

| | | | |
|---|---|---|---|
| 7,223,696 B2 | 5/2007 | Leedy | |
| 9,167,685 B2* | 10/2015 | Ikemoto | H05K 1/0281 |
| 9,690,032 B1 | 6/2017 | Nichol et al. | |
| 9,991,467 B2* | 6/2018 | Namkung | H01L 51/5253 |
| 2012/0307423 A1* | 12/2012 | Bohn | G06F 1/1641 |
| | | | 361/679.01 |
| 2013/0148312 A1* | 6/2013 | Han | H05K 7/00 |
| | | | 361/736 |
| 2014/0042406 A1* | 2/2014 | Degner | H01L 27/326 |
| | | | 257/40 |
| 2014/0240985 A1* | 8/2014 | Kim | H05K 1/028 |
| | | | 362/249.04 |

FOREIGN PATENT DOCUMENTS

| | | |
|---|---|---|
| JP | 4-62885 A | 2/1992 |
| JP | 10-85965 A | 4/1998 |
| JP | 2002-319781 A | 10/2002 |
| JP | 2003-116067 A | 4/2003 |
| JP | 2003-522401 A | 7/2003 |
| JP | 2004-501511 A | 1/2004 |
| JP | 2005-303172 A | 10/2005 |
| JP | 2006-295038 A | 10/2006 |
| KR | 10-2010-0029629 | 3/2010 |
| TW | 201526723 A | 7/2015 |
| TW | 201603631 A | 1/2016 |
| TW | 201621849 A | 6/2016 |
| TW | 201640632 A | 11/2016 |
| WO | 2016/132870 A1 | 8/2016 |

OTHER PUBLICATIONS

Japanese Office Action dated Jun. 12, 2019 for Japanese Patent Application No. 2018-078830, 3 pages.

Korean Office Action dated Apr. 17, 2019 for Korean Patent Application No. 10-2018-0045458, 7 pages.

* cited by examiner

CHIP ON FILM PACKAGE AND FLEXIBLE SUBSTRATE THEREOF

FIELD OF THE INVENTION

This invention relates to a chip on film package, and more particularly relates to a chip on film package able to avoid breaking caused by bending stress.

BACKGROUND OF THE INVENTION

Display driver IC is a critical component in consumer electronics and usually packaged by technologies such as chip on film (COF) or tape carrier package (TCP). Inner leads of flexible circuit substrate are bonded with bumps on chip using heat bonding, and outer leads on two sides of flexible circuit substrate are respectively bonded with display panel and circuit board. Recently, owing to commercial displays have thinning and full screen tendencies, flexible circuit substrate has to be bent to satisfy equipment requirements when bonding with display panel and circuit board, however, components on curved region of flexible circuit substrate may be damaged or broken by bending stress. Accordingly, exploring ways and means to effectively reduce bending stress is required.

SUMMARY

An object of the present invention is to provide a chip on film package which includes a chip and a flexible substrate. The flexible substrate includes a film and a circuit layer, the film has a first surface and a second surface opposite the first surface, and the circuit layer is formed on the first surface and electrically connected to the chip. At least one groove having a groove bottom surface is recessed on the second surface. When the circuit layer of the flexible substrate is bonded to external electronic components, the flexible substrate is bent to form a plurality of flat portions and at least one curved portion located between the flat portions. The groove is located on the curved portion.

Another object of the present invention is to provide a flexible substrate, which includes a film and a circuit layer. The film has a first surface and a second surface opposite the first surface, and the circuit layer is formed on the first surface. At least one groove having a groove bottom surface is recessed on the second surface. When the circuit layer of the flexible substrate is bonded to external electronic components, the flexible substrate is bent to form a plurality of flat portions and at least one curved portion located between the flat portions. The groove is located on the curved portion.

The film on the curved portion is thinned by forming the groove so can improve the flexibility of the flexible substrate and prevent the circuit layer or other components on the flexible substrate from damage or break caused by bending stress.

DETAILED DESCRIPTION OF THE INVENTION

Figure 1:
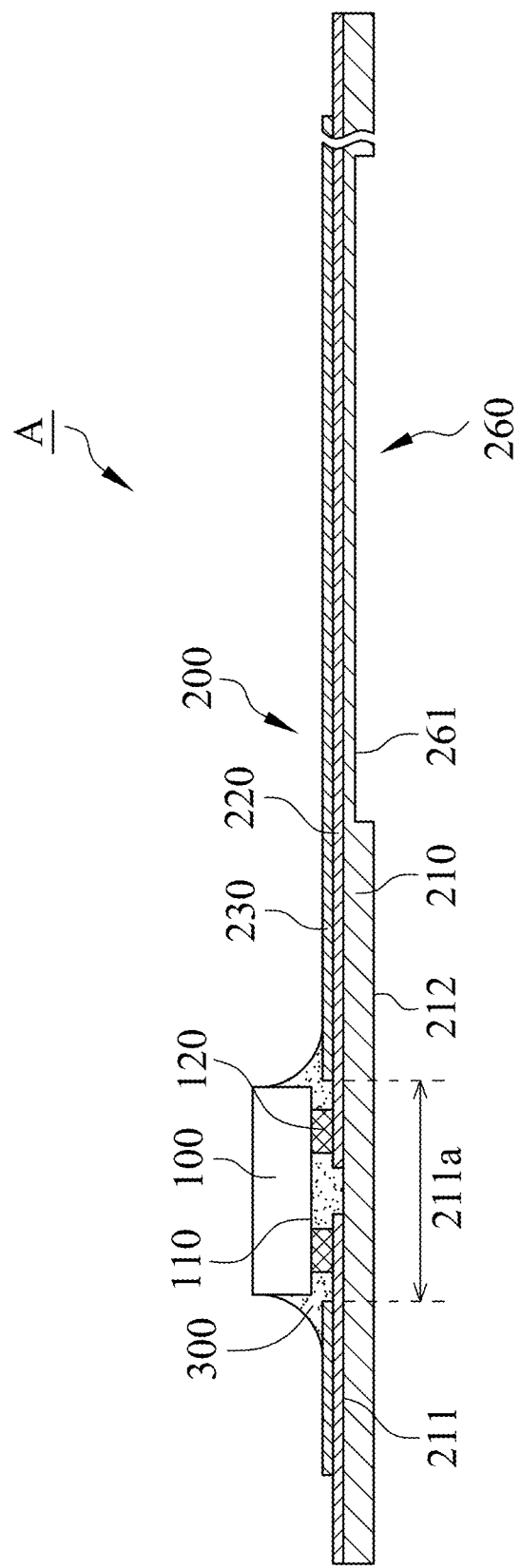
FIG. 1 is a cross-section view diagram illustrating a chip on film package in accordance with a first embodiment of the present invention.

With reference to FIG. 1, a chip on film (COF) package A of a first embodiment of the present invention includes a chip 100 and a flexible substrate 200. Preferably, the COF package A further includes a package adhesive 300 filled between the chip 100 and the flexible substrate 200. The package adhesive 300 is, but not limit to, underfill.

With reference to FIG. 1, the flexible substrate 200 includes a film 210 and a circuit layer 220. The film 210 has a first surface 211 and a second surface 212 opposite the first surface 211, and the circuit layer 220 is formed on the first surface 211 and electrically connected to the chip 100. In the first embodiment, the flexible substrate 200 further includes a protection layer 230 which overlays the first surface 211 and the circuit layer 220. Preferably, the film 210, the circuit layer 220 and the protection layer 230 are, but not limit to, polyimide (PI) film, copper wires and solder resist, respectively.

With reference to FIG. 1, a chip-disposed region 211a, defined on the first surface 211, is revealed by the protection layer 230. In other words, the protection layer 230 does not overlay on the chip-disposed region 211a. The chip 100 is placed on the chip-disposed region 211a and electrically connected to the circuit layer 220. A plurality of bumps 120, provided for electrical connection between the chip 100 and the circuit layer 220, are disposed on an active surface 110 of the chip 100. The bumps 120 may be made of gold, copper, silver, nickel or an alloy thereof.

Figure 2:
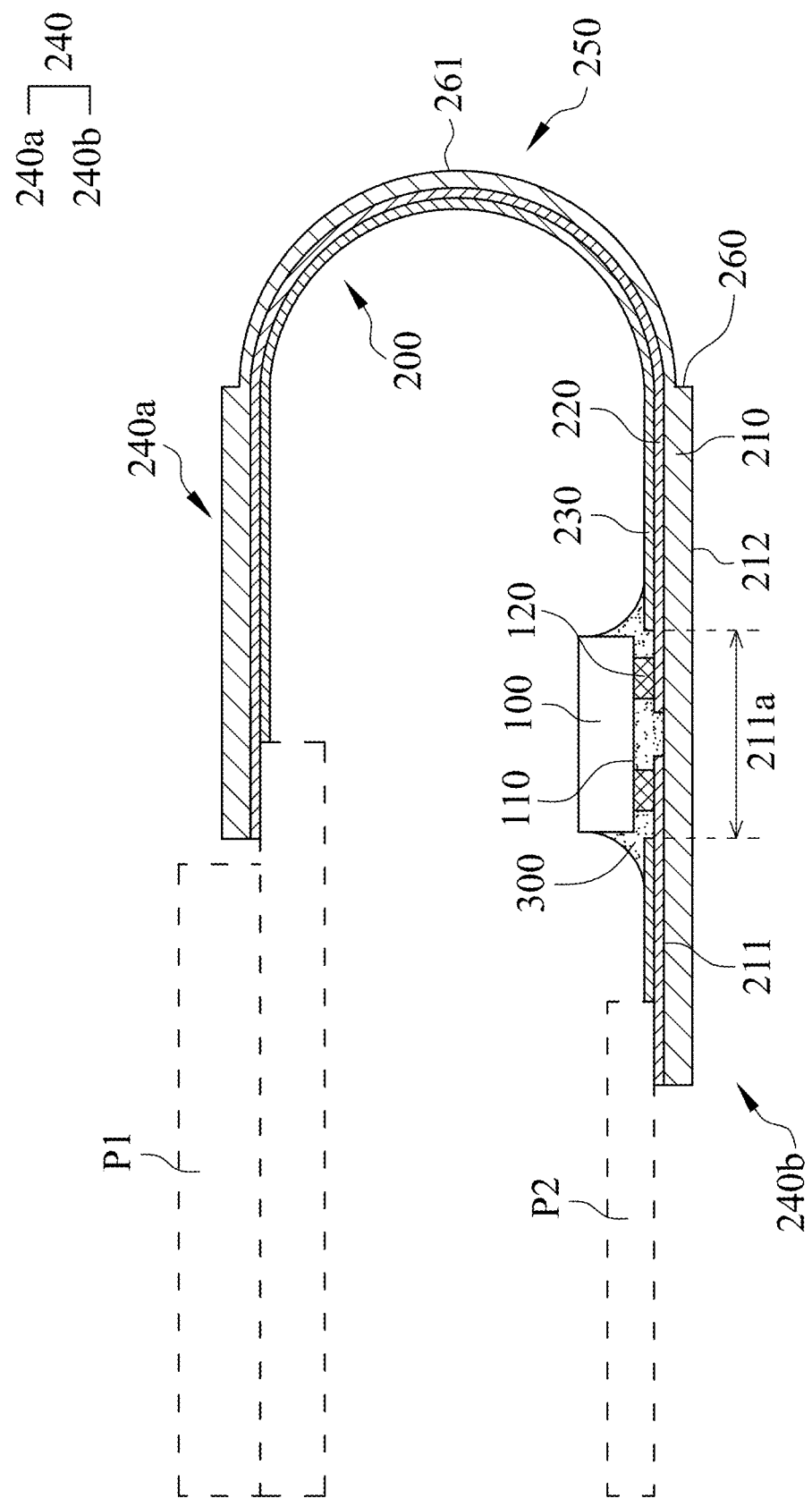
FIG. 2 is a cross-section view diagram illustrating the chip on film package bonding to external electronic components in accordance with the first embodiment of the present invention.

With reference to FIGS. 1 and 2, when the flexible substrate 200 is bonded to external electronic components through the circuit layer 220 disposed on the first surface 211, the flexible substrate 200 is bent to form a plurality of flat portions 240 and at least one curved portion 250 located between the flat portions 240. In the first embodiment, a first flat portion 240a, a second flat portion 240b and a curved portion 250 are formed after bending the flexible substrate 200, and the curved portion 250 is located between the first flat portion 240a and the second flat portion 240b. The first flat portion 240a is provided to bond with a display panel P1 and the second flat portion 240b is provided to bond with a circuit board P2. The chip-disposed region 211a is preferably located on inner side of the second flat portion 240b.

With reference to FIGS. 1 and 2, at least one groove 260 is recessed on the second surface 212 by laser-trimming the film 210. By controlling laser intensity and trimming time, the groove 260 is designed to not through the film 210 such that the groove 260 has a groove bottom surface 261. Preferably, the film 210 is trimmed by a laser beam of 355 to 1064 nm wavelength to form the groove 260. A thickness exists between the groove bottom surface 261 and the first surface 211 of the film 210 and it is the shortest distance between the groove bottom surface 261 and the first surface 211. The thickness is higher than or equal to 6 μm and preferably ranges between 6 μm and 20 μm. In this embodiment, the film 210 is trimmed by a laser beam of 355 nm wavelength and the thickness between the groove bottom surface 261 and the first surface 211 is substantially equal to 15 μm.

With reference to FIGS. 1 and 2, the groove 260 is recessed on a predetermined bending region of the flexible substrate 200. As a result, the groove 260 will be located on the curved portion 250 when bending the flexible substrate 200, and the film 210 on the curved portion 250 is thinner than the film 210 on the first and second flat portions 240a and 240b. The flexible substrate 200 is preferably bent toward the first surface 211 so the groove 260 is located on outer side of the curved portion 250. Furthermore, because a part of the circuit layer 220 is located between the protection layer 230 and the groove 260, the groove 260 can prevent the circuit layer 220 and the protection layer 230 on the curved portion 250 from damage or break caused by bending stress.

Figure 3:
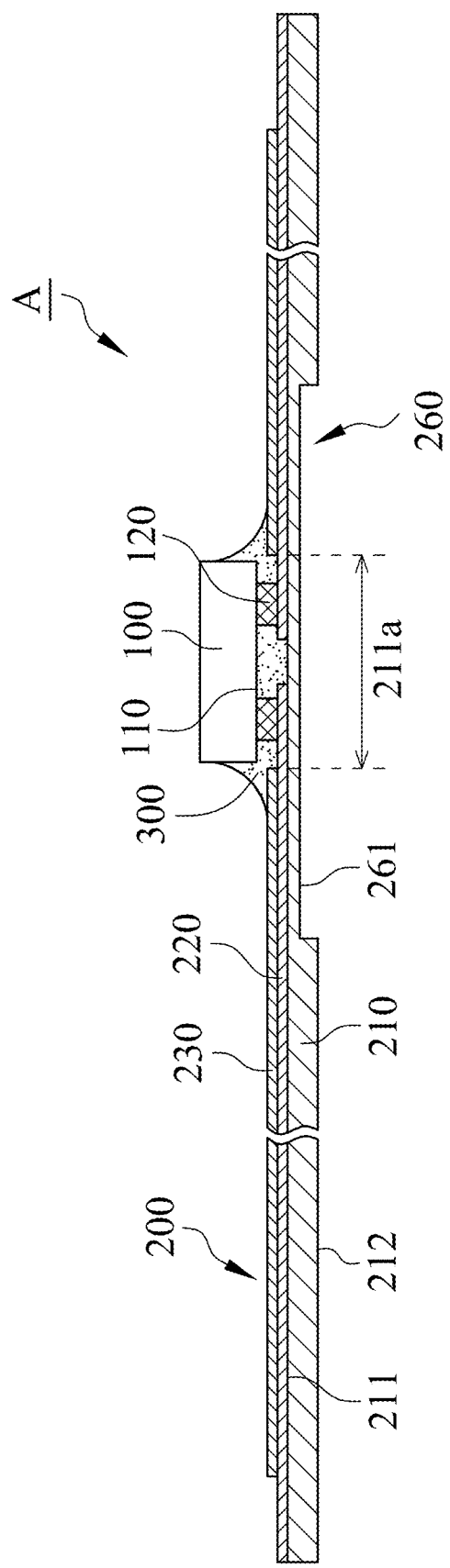
FIG. 3 is a cross-section view diagram illustrating a chip on film package in accordance with a second embodiment of the present invention.
Figure 4:
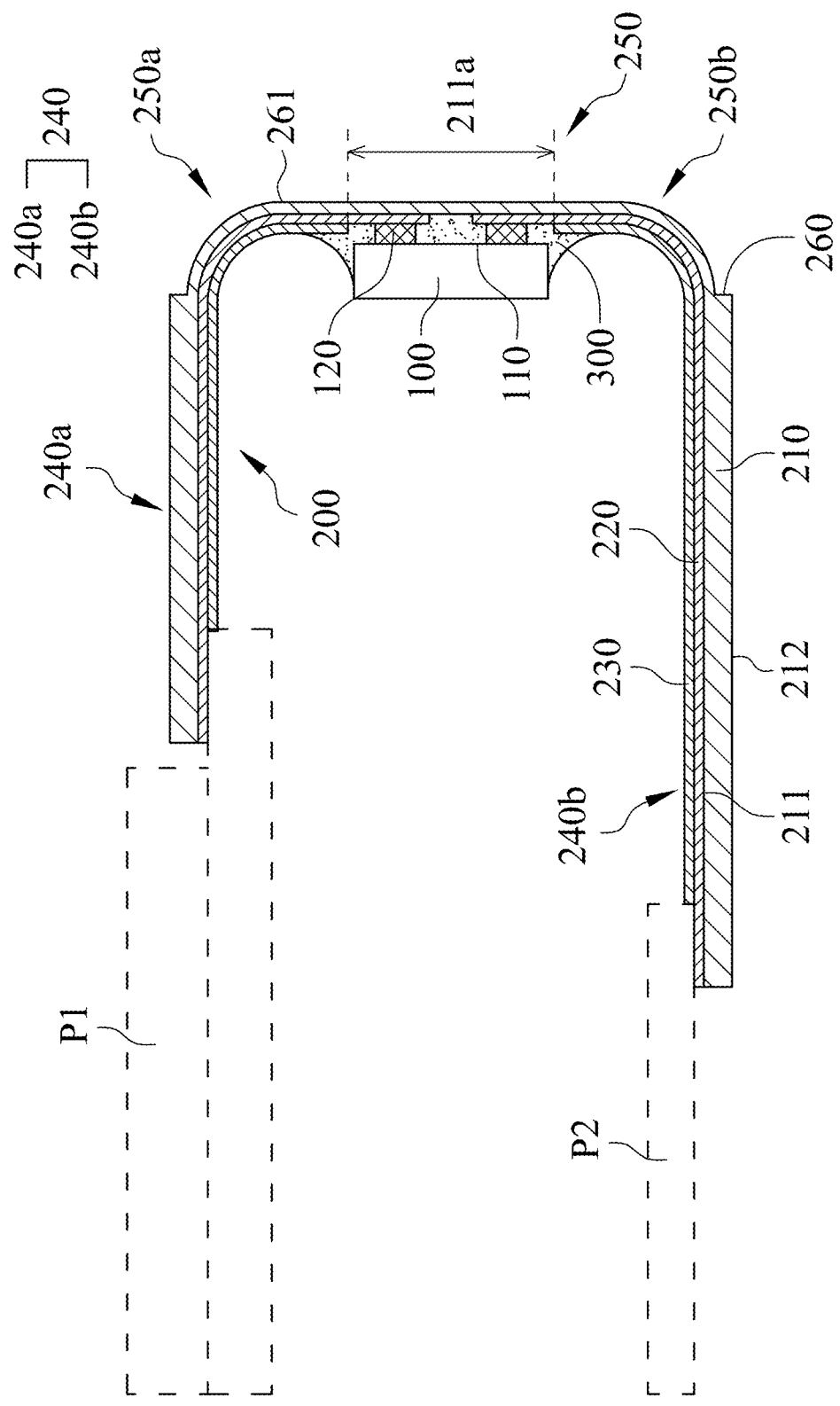
FIG. 4 is a cross-section view diagram illustrating the chip on film package bonding to external electronic components in accordance with the second embodiment of the present invention.

With reference to FIGS. 3 and 4, these drawings represent a chip on film package A of a second embodiment of the present invention. The difference between the first and second embodiments is the position of the chip-disposed region 211a. The chip-disposed region 211a of the second embodiment is located on the curved portion 250, that is to say the chip-disposed region 211a is located on the first surface 211 where opposite the groove 260, and a part of the circuit layer 220 is located between the chip 100 and the groove 260. Owing to the package adhesive 300, filled between the chip 100 and the flexible substrate 200, may bring stress concentration on the curved portion 250, the groove 260 is designed to have a width which is equal to or wider than those of the chip 100 and the package adhesive 300 along the same direction, such that the groove 260 can cover the chip 100 and the package adhesive 300 completely to prevent the chip 100 from separating and damaging result of the stress from the curved portion 250 and the package adhesive 300.

Figure 5:
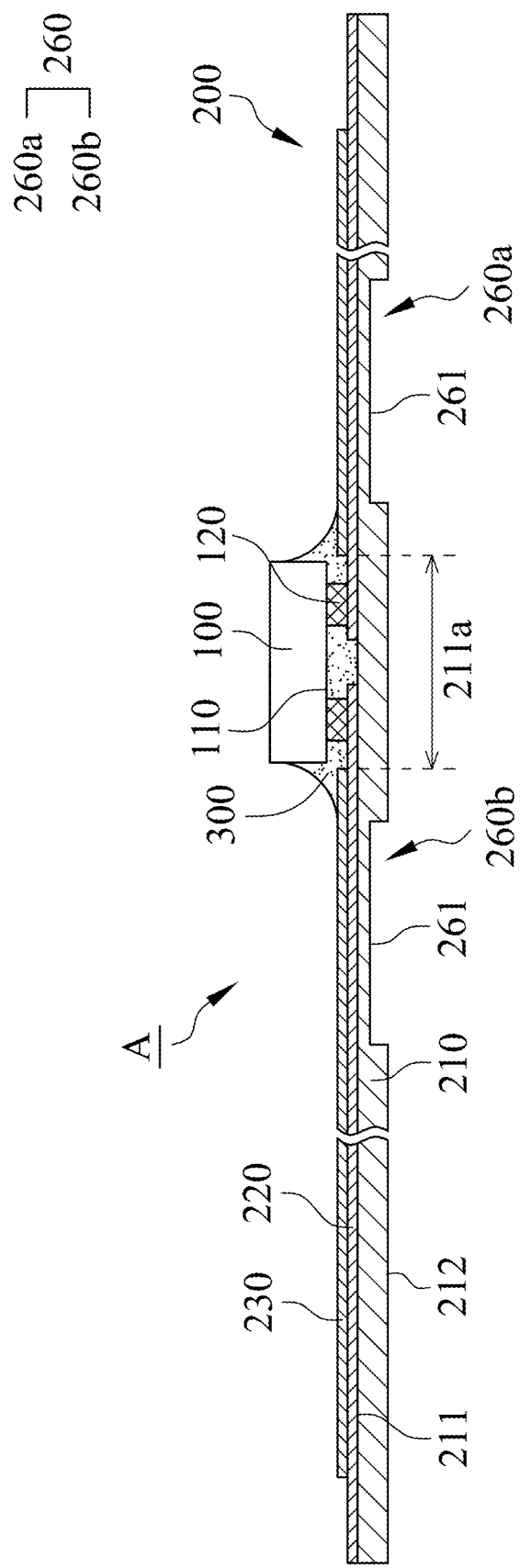
FIG. 5 is a cross-section view diagram illustrating a chip on film package in accordance with a third embodiment of the present invention.
Figure 6:
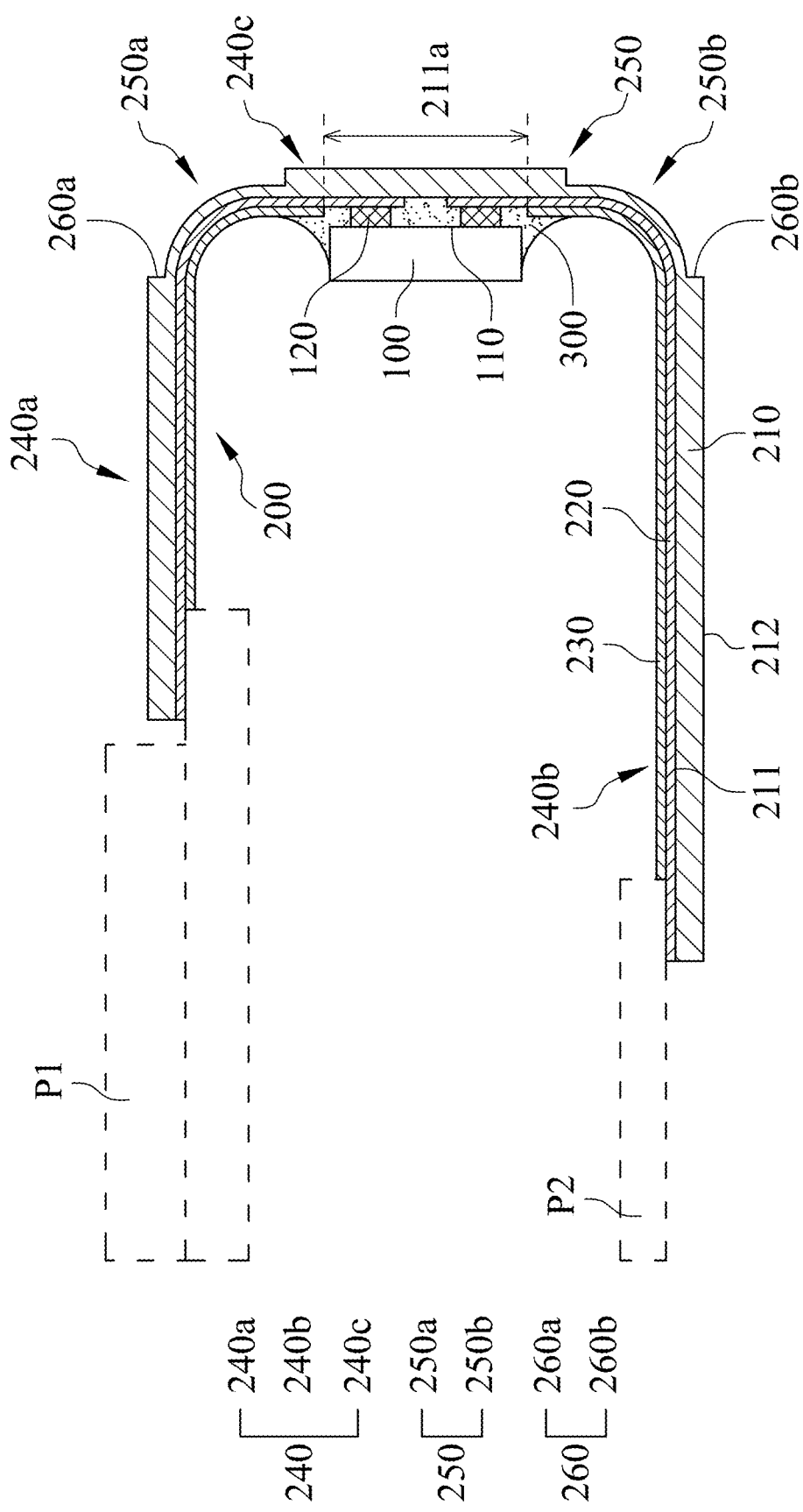
FIG. 6 is a cross-section view diagram illustrating the chip on film package bonding to external electronic components in accordance with the third embodiment of the present invention.

A chip on film package A of a third embodiment of the present invention is represented in FIGS. 5 and 6. The difference between the first and third embodiments is that the flexible substrate 200 of the third embodiment after bending has a first flat portion 240a, a second flat portion 240b, a third flat portion 240c, a first curved portion 250a and a second curved portion 250b. The first curved portion 250a is located between the first flat portion 240a and the third flat portion 240c, and the second curved portion 250b is located between the second flat portion 240b and the third flat portion 240c. In the third embodiment, a first groove 260a and a second groove 260b are recessed on the second surface 212 of the film 210 and located on the first curved portion 250a and the second curved portion 250b, respectively, when the flexible substrate 200 is bent.

With reference to FIG. 6, the first groove 260a and the second groove 260b are located on the outer side of the first curved portion 250a and the second curved portion 250b, respectively. Owing to a part of the circuit layer 220 is located between the protection 230 and the first groove 260a and a part of the circuit layer 220 is located between the protection layer 230 and the second groove 260b, the first groove 260a and the second groove 260b can prevent the circuit layer 220 and the protection layer 230 on the first curved portion 250a and the second curved portion 250b from peeling off from the film 210 due to bending stress.

With reference to FIGS. 5 and 6, the chip-disposed region 211a of the third embodiment is located on the first surface 211 of the third flat portion 240c and between the first curved portion 250a and the second curved portion 250b so the chip 100 is disposed on the third flat portion 240c and also located between the first curved portion 250a and the second curved portion 250b.

Because the chip 100 is made of a material that has a higher hardness, the film 210 on the chip-disposed region 211a will not be bent after bending the flexible substrate 200, as a result, the third flat portion 240c is formed between the first curved portion 250a and the second curved portion 250b. Otherwise, thinning the film 210 on the third flat portion 240c is not required such that the third flat portion 240c can efficiently support the chip 100 to protect the chip 100 from separating from the flexible substrate 200.

Thinning the film 210 on the curved portion 250 can form the groove 260 to enhance the flexibility of the flexible substrate 200 and efficiently avoid damage and break of the circuit layer 220, the protection layer 230 or other components on the flexible substrate 200 result of bending stress.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:
1. A chip on film package comprising:
a chip and
a flexible substrate having a film and a circuit layer, the film has a first surface and a second surface opposite the first surface, wherein the circuit layer is formed on the first surface, and a groove having a groove bottom surface is recessed on the second surface with a chip-disposed region defined on the first surface directly above the groove on the second surface and the chip placed on the chip-disposed region and electrically connected to the circuit layer, wherein the flexible substrate is bent to form a plurality of flat portions and at least one curved portion located between the flat portions when the circuit layer of the flexible substrate is bonded to external electronic components, and wherein the chip and the groove are located on opposite sides of the curved portion.

2. The chip on film package in accordance with claim 1, wherein the groove is formed on the film by laser trimming.

3. The chip on film package in accordance with claim 1, wherein a thickness exists between the groove bottom surface and the first surface, and the thickness is higher than or equal to 6 μm.

4. The chip on film package in accordance with claim 3, wherein the thickness is between 6 and 20 μm.

5. The chip on film package in accordance with claim 1, wherein the groove is located on an outer side of the curved portion.

6. The chip on film package in accordance with claim 1, wherein the flexible substrate further includes a protection layer overlaying the first surface and the circuit layer, and a part of the circuit layer is located between the protection layer and the groove.

7. The chip on film package in accordance with claim 1, wherein a part of the circuit layer is located between the chip and the groove.

8. The chip on film package in accordance with claim 7, wherein the groove has a width which is wider than or equal to a width of the chip.

9. The chip on film package in accordance with claim 7 further comprising a package adhesive, wherein the package adhesive is filled between the chip and the flexible substrate, and the groove has a width which is wider than or equal to a width of the package adhesive.

10. A flexible substrate comprising:
   a circuit layer and
   a film having a first surface and a second surface opposite the first surface, wherein the circuit layer is formed on the first surface and a groove having a groove bottom surface is recessed on the second surface with a chip-disposed region defined on the first surface directly above the groove on the second surface, wherein the flexible substrate is bent to form a plurality of flat portions and at least one curved portion located between the flat portions when the circuit layer of the flexible substrate is bonded to external electronic components, and wherein the chip-disposed region and the groove are located on opposite sides of the curved portion.

11. The flexible substrate in accordance with claim 10, wherein the groove is formed on the film by laser trimming.

12. The flexible substrate in accordance with claim 10, wherein a thickness exists between the groove bottom surface and the first surface, and the thickness is higher than or equal to 6 µm.

13. The flexible substrate in accordance with claim 12, wherein the thickness is between 6 and 20 µm.

14. The flexible substrate in accordance with claim 10, wherein the groove is located on an outer side of the curved portion.

15. The flexible substrate in accordance with claim 10 further comprising a protection layer overlaying the first surface and the circuit layer, wherein a part of the circuit layer is located between the protection layer and the groove.

* * * * *